United States Patent
Schauwecker et al.

(10) Patent No.: US 6,265,960 B1
(45) Date of Patent: Jul. 24, 2001

(54) ACTIVELY SHIELDED MAGNET SYSTEM WITH $Z^2$ SHIM

(75) Inventors: Robert Schauwecker; Pierre-Alain Bovier, both of Zurich; Daniel Eckert, Duebendorf, all of (CH)

(73) Assignee: Bruker AG, Faellanden (CH)

( * ) Notice: Subject to any disclaimer, the term of this patent is extended or adjusted under 35 U.S.C. 154(b) by 39 days.

(21) Appl. No.: 09/643,933

(22) Filed: Aug. 23, 2000

(30) Foreign Application Priority Data

Aug. 27, 1999 (DE) .............................................. 199 40 694

(51) Int. Cl.[7] ................................. G01V 3/00; G01V 3/14
(52) U.S. Cl. ............................................. 335/301; 324/320
(58) Field of Search .......................... 335/216, 296–301; 324/318–320

(56) References Cited

U.S. PATENT DOCUMENTS 5,650,724 * 7/1997 Yamagata ............................. 324/320

FOREIGN PATENT DOCUMENTS 0 144 171    12/1985 (EP) .

OTHER PUBLICATIONS

"NMR Magnet System 500 MHz/54 mm Ultra Shield Long Hold Time" Bruker Magnetics, 1999.

* cited by examiner

*Primary Examiner*—Ramon M. Barrera
(74) *Attorney, Agent, or Firm*—Paul Vincent

(57) ABSTRACT

A magnet system for magnetic resonance spectrometers comprising an actively shielded superconducting magnet with a radially inner and a radially outer coil system ($M_1$, $M_2$), wherein the two coil systems carry the same current and have identical opposite dipole moments, and comprising a shim coil system for correcting magnetic field inhomogeneities in the working volume, whose z component varies in proportion to $z^2$, is characterized in that the shim coil system comprises a radially inner shim coil set ($S_i$) which is inductively decoupled from the magnet system and generates a magnetic field in the working volume, whose z component varies like $\Delta H_0 + c_2 \cdot z^2$ with $c_2$=const., and a radially outer shim coil set ($S_a$) which is also inductively decoupled from the magnet system and generates a homogeneous magnetic field $-\Delta H_0$ in the working volume. This produces a $Z^2$ shim system with technically simple means which is, on the one hand, compact and does not waste any unnecessary space in the area of the magnet windings, and on the other hand is not susceptible to disturbances due to fluctuating external magnetic fields.

22 Claims, 5 Drawing Sheets

ACTIVELY SHIELDED MAGNET SYSTEM WITH $Z^2$ SHIM

This application claims Paris Convention priority of DE 199 40 694.4 filed Aug. 27, 1999 the complete disclosure of which is hereby incorporated by reference.

BACKGROUND OF THE INVENTION

The invention concerns a superconducting magnet system for magnetic resonance spectrometers, wherein the magnet system comprises an actively shielded superconducting magnet for generating a homogeneous magnetic field $H_0$ along a z-axis in a working volume, arranged about z=0, comprising a radially inner and a radially outer coil system, wherein the two coil systems carry approximately identical currents and have approximately identical opposite dipole moments, and wherein a shim system is provided comprising a superconducting shim coil system for correcting magnetic field inhomogeneities in the working volume, the z component of which is proportional to $z^2$.

An actively shielded superconducting magnet system of this kind, comprising a $Z^2$ shim is contained e.g. in the NMR Magnet System 500 SB UltraShield™ distributed by the company Bruker Magnetics and shown in the company leaflet dated May 15, 1999.

An actively shielded magnet system without $Z^2$ shim is e.g. known from EP 0 144 171 A1.

To achieve a good resolution of the resonance lines in the spectrum by means of magnetic resonance spectroscopic methods, the magnetic field must have a good homogeneity in the sample volume. The basic homogeneity of the superconducting magnet can be optimized with the geometric arrangement of the field-generating magnet coils. With demanding applications, such as high-resolution nuclear magnetic resonance spectroscopy, the basic homogeneity of the magnet is, in most cases, insufficient, since e.g. deviations from the design occur due to production tolerances. To compensate residual inhomogeneities of the magnet, the magnet system comprises autonomous superconducting coils which can compensate field inhomogeneities with a particular geometric symmetry in the sample volume, so-called shims.

An example of such a shim is the $Z^2$ shim which generates a field with a strength proportional to $z^2$ along the magnet axis z. A problem with known $Z^2$ shim means according to prior art is the fact that with large magnets, the shim must be wound within the magnet coils since it would be too weak at the outside. This reduces the space for magnet windings which makes the magnet more expensive and increases the stray field with the consequence that stray field shielding must be stronger for magnet systems with active stray field compensation.

Optimization of the $Z^2$ shim can be achieved by reducing the space required for the $Z^2$ shim coils which are wound radially within the magnet windings. This is possible without reducing the shim efficiency only by distributing the shim coils onto several radii. This gives rise to new problems, in particular in connection with the coupling of the shim with fluctuating external magnetic fields.

In contrast thereto, it is the underlying purpose of the present invention to optimize a magnet system of the above-described kind with as simple as possible means such that the above-mentioned problems do not occur.

SUMMARY OF THE INVENTION

This object is achieved in accordance with the invention in that the shim coil system comprises a radially inner shim coil set which is substantially inductively decoupled from the magnet system and mainly generates a magnetic field in the working volume whose z component varies, as $\Delta H_0 + c_2 \cdot z^2$ with $c_2$=const., and a radially outer shim coil set which is also substantially inductively decoupled from the magnet system and generates a homogeneous magnetic field $-\Delta H_0$ in the working volume. A positive side effect thereby is the reduction of the susceptibility to disturbances of the magnet itself.

FIG. 2 schematically shows a conventional $Z^2$ shim according to prior art. The $\Delta H_0$ contribution of the coil $S_1'$ which provides the main contribution to the shim strength $c_2$ is compensated for with a coil pair $S_2'$ ($\Delta H_0$: homogeneous field part of the coil per ampere=field gradient $H_0$ of order zero generated per ampere). With complete $\Delta H_0$ compensation, the coil pair $S_2'$ will normally couple more strongly with the magnet than $S_1'$. This coupling is eliminated by a coil pair $S_3'$ which strongly reduces the shim efficiency $c_2$.

With the present invention, however, the shim is divided into a shim coil set $S_i$, decoupled from the magnet, comprising partial coils $S_1$ and $S_2$ for generating the gradient field $C_2 * z^2 + \Delta H_0$ and shim coil set $S_a$, also decoupled from the magnet, comprising partial coil $S_3$, which eliminates the impurity $\Delta H_0$. Since the $H_2$ efficiency of a coil with increasing coil radius R with a given length L decreases more than its $H_0$ efficiency, the gradient-generating shim coil set $S_i$ must lie on a smaller radius than the shim coil set $S_a$ which suppresses $\Delta H_0$.

The advantage of this new shim system consists in that with suppression of $\Delta H_0$ by a radially outer shim coil set, the shim strength $c_2$ of the radially inner shim coil set is only slightly weakened. This necessitates fewer windings in the radially inner shim coil set and the magnet gets more compact if the radially inner shim coil set is at a location where otherwise magnet windings would be wound.

The advantage of separate decoupling of the inner and outer shim coil sets from the magnet consists in that in this manner, an embodiment is possible wherein each of the two shim coil sets is superconductingly short-circuited individually without the possibility that the individual shim coil sets can be charged e.g. by a magnetic drift, a quench or during spontaneous opening of the main switch of the magnet. Furthermore, in this fashion, also the entire shim is decoupled from the magnet which has the advantage that induced currents in the magnet are reduced during charging of the shim.

In a preferred embodiment of the magnet system in accordance with the invention, both the radially inner shim coil set and the radially outer shim coil set can be individually superconductingly short-circuited. The fact that the inner and outer shim coil set can be separately short-circuited has i.a. advantages for the manufacture of the magnet system, since bridging of the radius difference between the radially inner and outer shim coil set does not necessarily have to be superconducting. It is furthermore possible to operate the two shim portions with different currents.

A decisive advantage of separately short-circuiting the radially inner and outer shim coil sets shows when external field fluctuations occur. To prevent field inhomogeneities in the form of $\Delta I_2 * c_2 * z^2$ it is now sufficient to decouple only the inner shim coil set for the disturbance (i.e. to dimension it so that an external disturbance does not induce a current $\Delta I_2$) since the outer shim coil set generates essentially a homogeneous field if the external disturbance induces a current therein. It is possible to arrange the outer shim coil set additionally such that its reaction to the external field fluctuation can be used for dampening the homogeneous part of the field disturbance in the working volume.

In a particularly preferred embodiment of the inventive magnet system, the magnet system is part of an apparatus for high-resolution magnetic resonance spectroscopy. The advantages of the present invention pay off in particular in systems such as high-resolution magnetic resonance spectrometers since these magnet systems have anyway a larger volume than others due to the high homogeneity requirements, and thus increased compactness of the $Z^2$ shim is particularly effective.

A further development of this embodiment is advantageous, wherein the magnetic resonance apparatus comprises a means for field-locking the magnetic field generated in the working volume, wherein the radially inner and the radially outer shim coil sets are largely decoupled from the coils of the device for field-locking. An active field lock comprising a coil for compensating temporary field fluctuations in the sample volume is part of the standard equipment of high-resolution magnetic resonance systems. Decoupling of the field-lock coil from the radially inner and outer shim coil sets has the effect that when the lock coil is operated, induction of current in the shim is not possible. This maintains on the one hand the field homogeneity and on the other hand, the effect of the field lock coil is not impaired.

A further development is preferred, wherein the magnetic resonance apparatus comprises sweep coils, wherein the radially inner shim coil set and the radially outer shim coil set are largely decoupled from the sweep coils. Decoupling of any existing sweep coils from the radially inner and outer shim coil sets causes that current cannot be induced in the shim during operation of the sweep coils. This maintains on the one hand the field homogeneity during the field sweep and on the other hand prevents that the effect of the sweep coils is impaired.

In an advantageous embodiment, the radially inner and/or radially outer shim coil set consists of several partial coils. This arrangement is advantageous in that with several coils per shim coil set, there are more degrees of freedom for optimizing the shim strength and decoupling from the magnet.

A further development of this embodiment is characterized in that the radially inner shim coil set consists of three partial coils on a radius R arranged, one behind the other, axially and symmetrically about z=0, wherein the central partial coil has an axial length $L_1$ with $R \leq L_1 \leq 1.5R$ and the two axially outer partial coils have a polarity which is opposite to the polarity of the central partial coil. This arrangement achieves the maximum shim strength $c_2$ of a shim coil set on a certain radius for a certain number of ampere windings.

If the central partial coil of this system consists of two symmetrical coils, wound in the same direction, the $H_4$ gradient of the central coil, can be suppressed if it is too high. This effectively suppresses the field contribution of the inner shim coil set which is proportional to $Z^4$.

Advantageously, the radially outer shim coil set comprises only partial coils of identical polarity. The efficiency of the outer shim coil set for generating $-\Delta H_0$ would be reduced if partial coils of different polarity were used, e.g. for decoupling from the actively shielded magnet.

An embodiment of the invention is also preferred, wherein the radially outer shim coil set is disposed in the direct radial vicinity of the radially outer field coil system of the actively shielded magnet. This allows simple and efficient decoupling of the outer shim coil set from the actively shielded magnet without using partial coils of different polarity, i.e. without weakening the $H_0$ efficiency.

An embodiment is also advantageous, wherein the coils of the radially inner and/or radially outer shim coil set are distributed onto several radii. This produces more degrees of freedom for the shim design, in particular, there are better possibilities for decoupling the shim coil sets from the actively shielded magnet.

To realize one of the potential advantages of the arrangement in accordance with claim 2 (i.e. field inhomogeneity in the form of $\Delta I_2 * c_2 * z^2$ is not generated during external field fluctuations in the working volume), it is possible to reduce the dipole moment $D_i$ of the inner shim coil set. The inner shim coil set is thereby decoupled from external homogeneous disturbance sources and does not react with a current change $\Delta I_2$ which would cause undesirable disturbance of the field homogeneity in the working volume. The dipole moment is preferably $D_i \approx 0$.

In a further preferred embodiment, the inductive coupling between the radially inner and the radially outer shim coil set is at least approximately 0. This prevents on the one hand that a possible reaction of the radially outer shim coil set to an external disturbance can be transmitted to the inner shim coil set, which would cause disturbance of the field homogeneity in the working volume. On the other hand, the decoupling between the shim coil sets allows that both can be charged individually without mutual influence.

In a further development of this embodiment, the radially outer shim coil set is used as $Z^0$ shim. Thus, the outer shim coil set produces a homogeneous field in the working volume and is decoupled from the other coils of the magnet system. This advantage can, however, only be utilized with appropriate wiring.

A further preferred embodiment is characterized in that the radially inner shim coil set is electrically connected in series with the radially outer shim coil set, and that at least two superconducting switches are provided to superconductingly short-circuit the two shim coil sets separately. The series connection of the two shim coil sets allows simultaneous charging with a charging current.

In a first further development, the series connection of the two shim coil sets is superconducting.

There is the variant that one of the superconducting switches is switched in parallel to the two shim coil sets, a second superconducting switch is switched only in parallel to one of the two shim coil sets, preferably in parallel to the radially inner shim coil set. This is advantageous in that the radially outer shim coil set can then be used as $Z^0$ shim.

A further variant provides that a superconducting switch is connected in parallel to each of the two shim coil sets.

In a second further development, the series connection of the two shim coil sets is resistive and one superconducting switch is connected in parallel to each of the two shim coil sets.

A current limiter is preferably provided for the differential current between the radially inner and the radially outer shim coil set. The current limiter can reduce an undesired differential current between the radially inner and outer shim coil set.

An advantageous further development of the invention is characterized in that the superconducting switches of the two shim coil sets each comprise a heating means electrically connected in series with a heating means of another superconducting switch of the two shim coil sets. Simultaneous charging of the inner and outer shim coil set requires that both switches are simultaneously heated (are open, i.e. resistive). Due to the special heater wiring, this requirement is automatically always met in the system according to the above further development.

The heating means of the superconducting switches of the two shim coil sets can preferably always be heated separately. The fact that each switch can be heated separately (open, i.e. resistive), allows autonomous charging of the inner and/or outer shim coil sets (e.g. of the outer as $Z^0$ shim).

Further advantages of the invention can be extracted from the description and the drawing. The features mentioned above and below can be used in accordance with the invention either individually or collectively in any arbitrary combination. The embodiments shown and described are not to be understood as exhaustive enumeration but rather have exemplary character for describing the invention.

The invention is shown in the drawing and is further explained by means of embodiments.

DESCRIPTION OF THE PREFERRED EMBODIMENT

Figure 1:
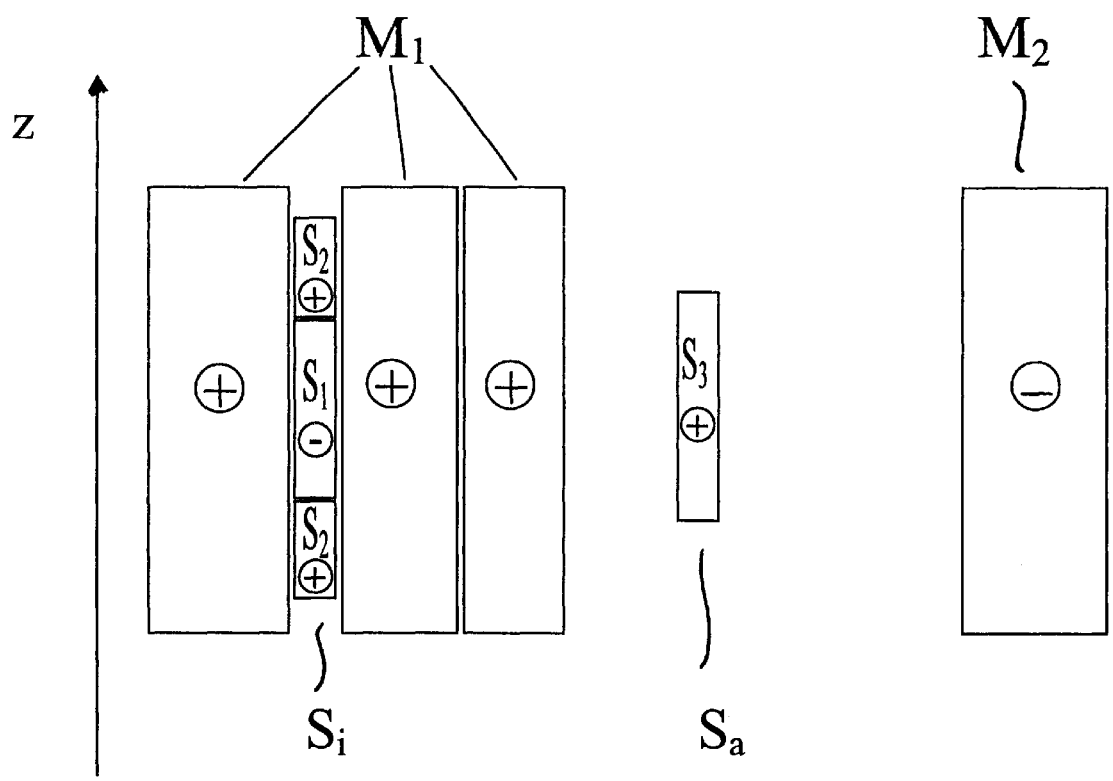
FIG. 1 shows a diagrammatic view of an embodiment of the inventive magnet system with $Z^2$ shim.

FIG. 1 shows an example of an inventive $Z^2$ shim system, wherein only the right-hand half is schematically shown in a sectional view through a plane containing the magnet axis z. The system comprises a radially inner shim coil set $S_i$, consisting of a partial coil $S_1$ with negative polarity and a partial coil $S_2$ with positive polarity axially surrounding the partial coil $S_1$ as well as a radially outer shim coil set $S_a$ comprising the partial coil $S_3$ which are integrated in a superconducting magnet system consisting of a magnet $M_1$ comprising several sections and an active stray field shielding coil $M_2$.

Figure 2:
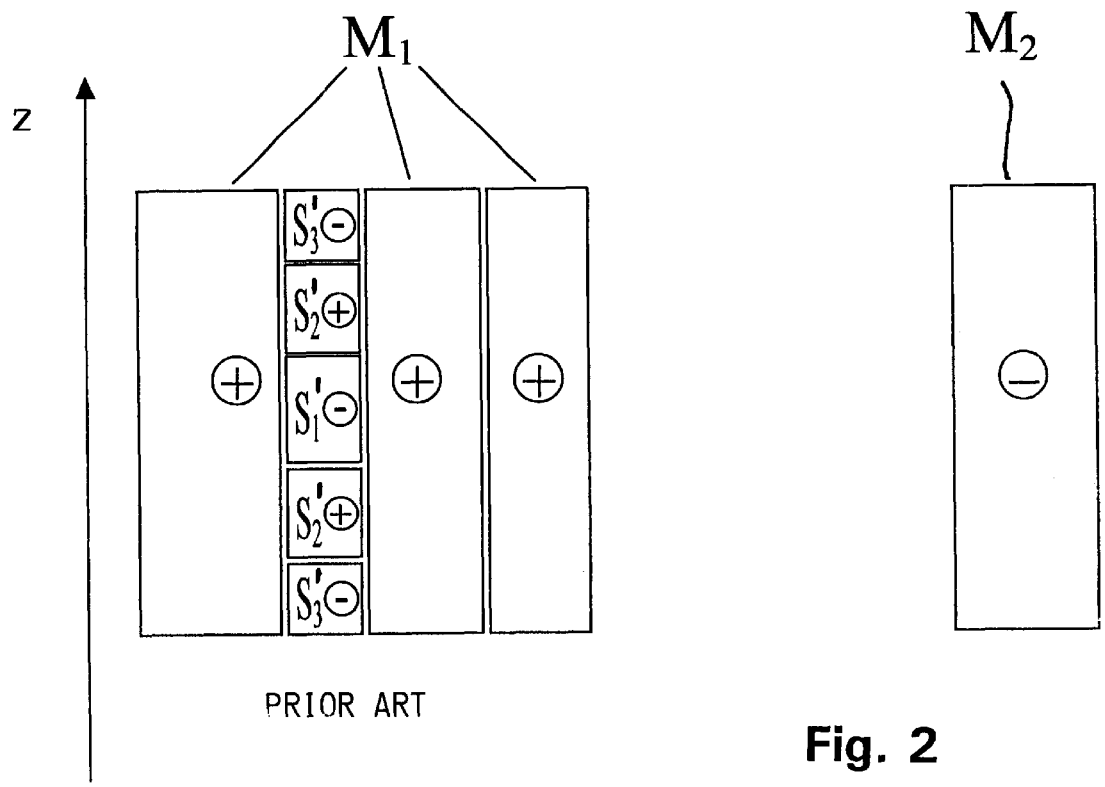
FIG. 2 shows a diagrammatic view of an actively shielded magnet system with $Z^2$ shim according to prior art.

FIG. 2 shows a diagrammatic view of a superconducting magnet system according to prior art consisting of a magnet $M_1$ comprising several sections and an active stray field shielding coil $M_2$ and a $Z^2$ shim system comprising the coils $S_1'$, $S_2'$, and $S_3'$.

Figure 3:
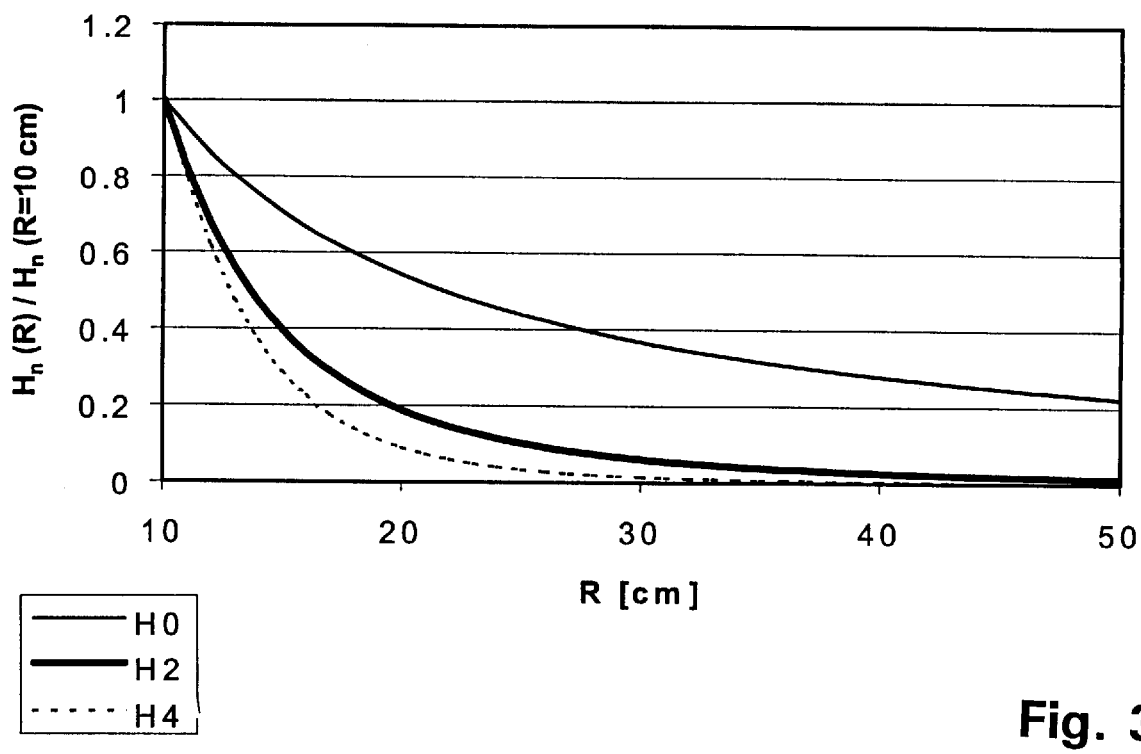
FIG. 3 shows the radius dependence of the field gradient.

FIG. 3 represents the radius dependence of the field gradients $H_0(R)$, $H_2(R)$ and $H_4(R)$, scaled with $H_0$ (R=10 cm), $H_2$(R=10 cm) and $H_4$(R=10 cm), respectively, for a cylindrical current density j=1 [A/cm] of the length L=10 [cm].

Figure 4:
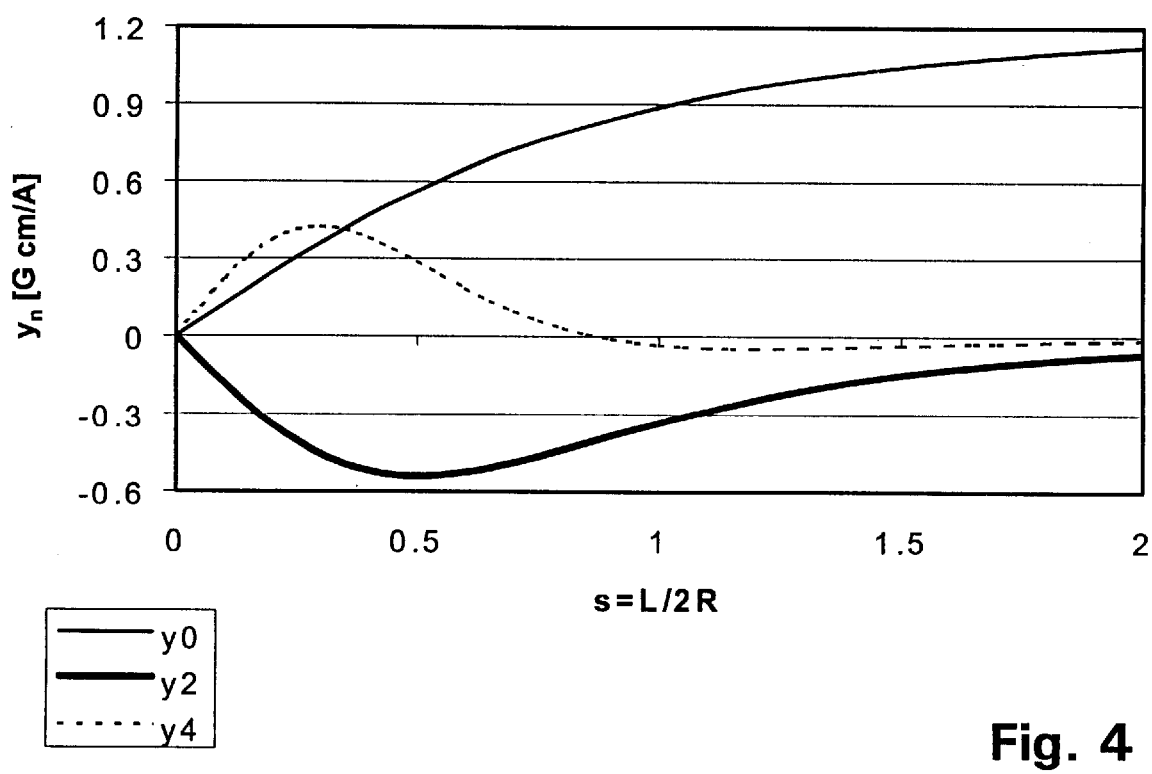
FIG. 4 shows the functions y(s)

$y_0$, $y_2$, $y_4$ in FIG. 4 are a function of s=L/2R with L: coil length, R: coil radius. The $y_n$ correspond to the gradients $H_n$ [G/cm$^n$] of a current carrying cylindrical surface with a radius of 1 cm and a current density of 1 A/cm. The extremum of $y_2$ at s≈0.5 means that a coil of predetermined radius and current density generates an $H_2$ gradient in the most effective manner if it has a length of L≈R.

Figure 5:
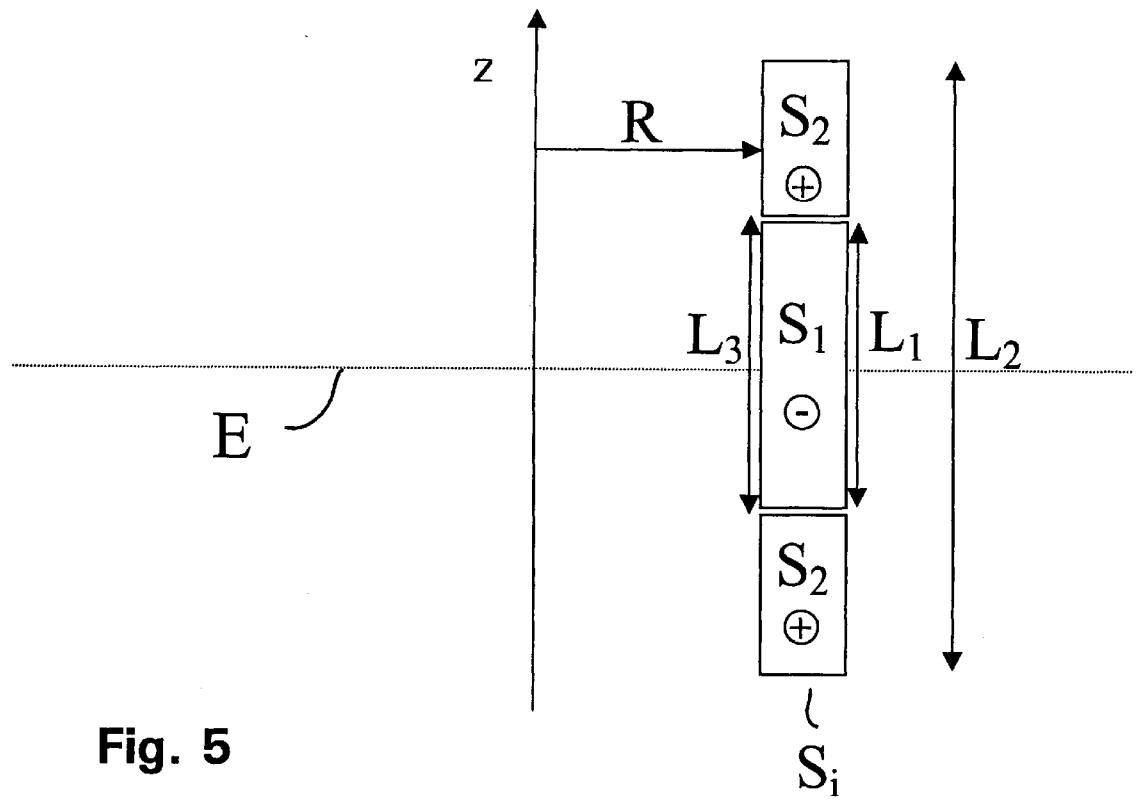
FIG. 5 shows a diagrammatic view of a three-coil embodiment of the radially inner shim coil set.

FIG. 5 shows a diagrammatic view corresponding to FIG. 1, of a three-coil embodiment of the radially inner shim coil set $S_i$ comprising the partial coils $S_1$ and $S_2$ with a radius R. The partial coil $S_1$ has an axial length $L_1$ whereas the partial coil $S_2$ consisting of two coils, has an axial length $L_2$, but has a recess (=notch) of an axial length $L_3$ in the region of the magnet central plane E, where the partial coil $S_1$ is disposed.

Figure 6:
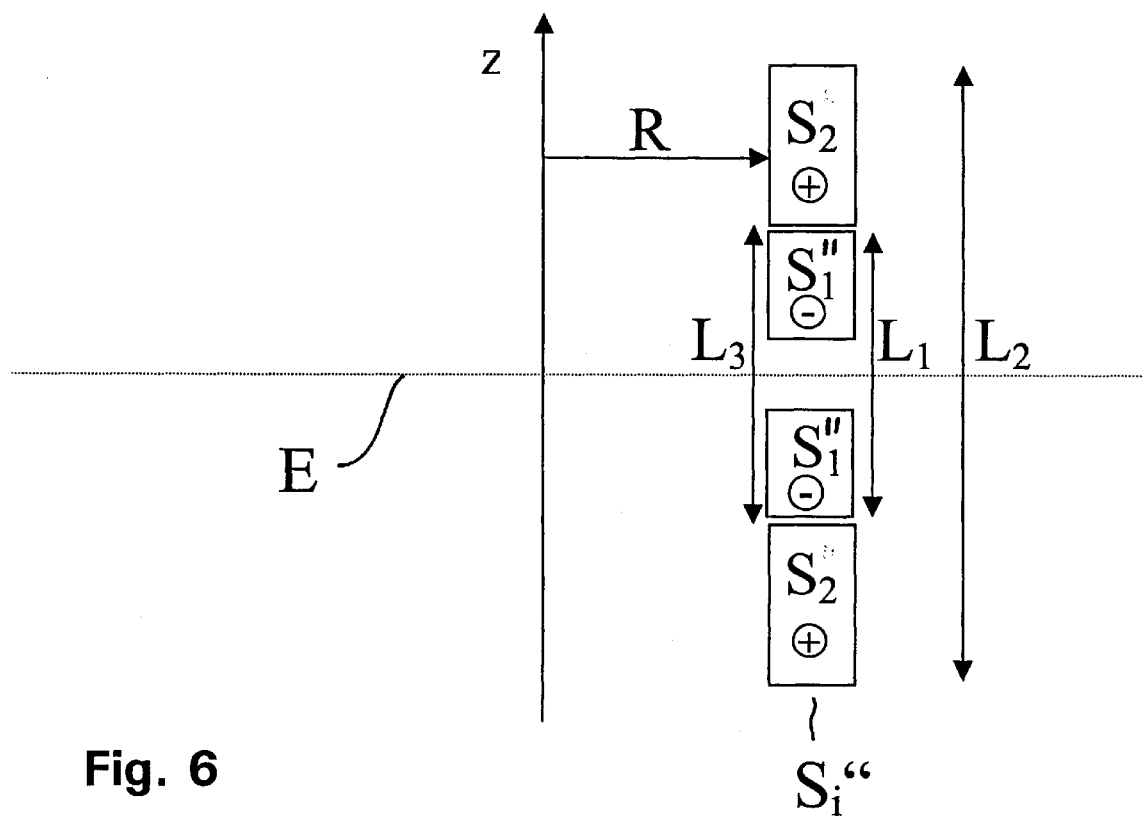
FIG. 6 corresponds to FIG. 5, wherein the central partial coil has two coils.

FIG. 6 shows a diagrammatic view of an embodiment of the radially inner shim coil set $S_i''$ of an inventive $Z^2$ shim with additional notch in the central partial coil $S_1''$ for suppressing an $H_4$ "inhomogeneity" of the shim field.

Figure 7:
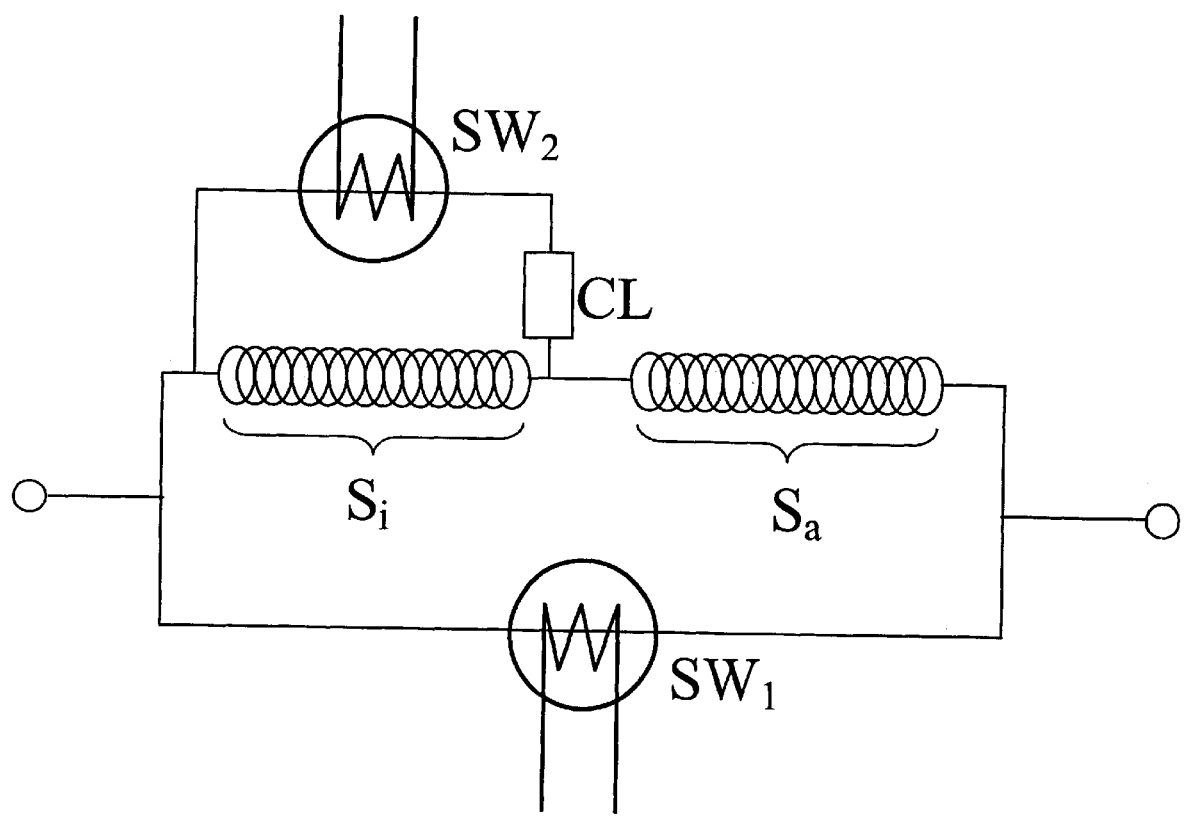
FIG. 7 shows an electric wiring scheme of a superconducting series connection of the radially inner and radially outer shim coil set comprising a first superconducting switch in parallel to the series connection and a second superconducting switch in parallel to the radially inner shim coil set.

FIG. 7 shows a wiring diagram of radially inner and radially outer shim coil sets $S_i$ and $S_a$ of an inventive $Z^2$ shim with superconducting series connection of the two shim coil sets. A first superconducting switch $SW_1$ bridges the entire shim, a second superconducting switch $SW_2$ bridges only the radially inner shim coil set $S_i$. The differential current between the two shim coil sets can be limited by a current limiter CL.

Figure 8:
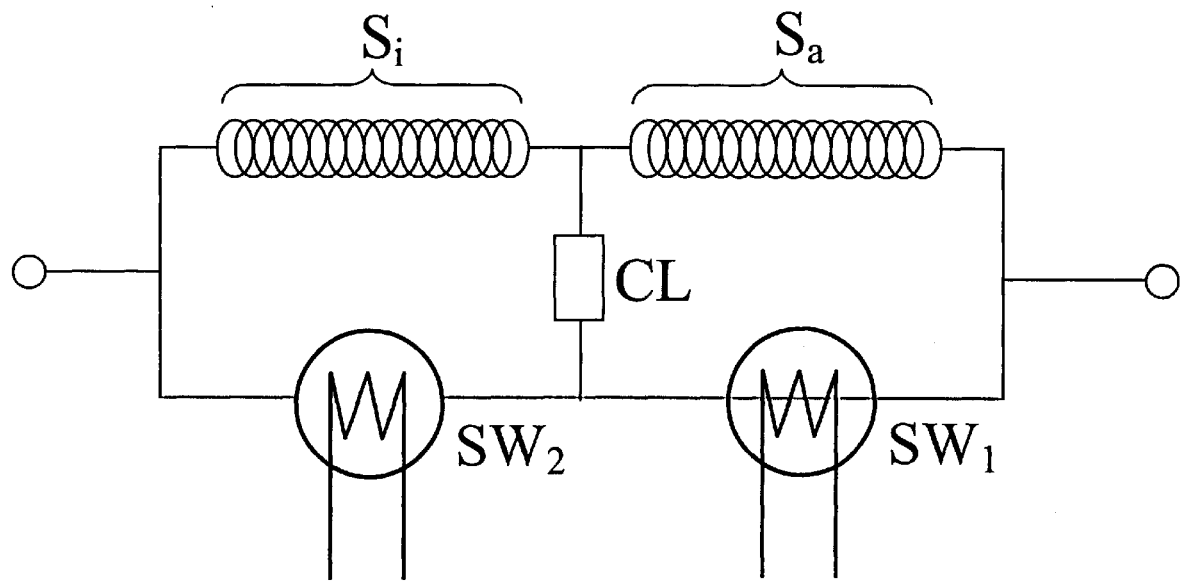
FIG. 8 corresponds to FIG. 7, comprising in each case a superconducting switch in parallel to the radially inner and to the radially outer shim coil set.

In the wiring scheme in accordance with FIG. 8, the two shim coil sets $S_i$ and $S_a$ are also superconductingly connected in series. The first superconducting switch $SW_1$ bridges the radially outer shim coil set $S_a$, the second superconducting switch $SW_2$ bridges the radially inner shim coil set $S_i$, The differential current between the two shim coil sets can also be limited here by a current limiter CL.

Figure 9:
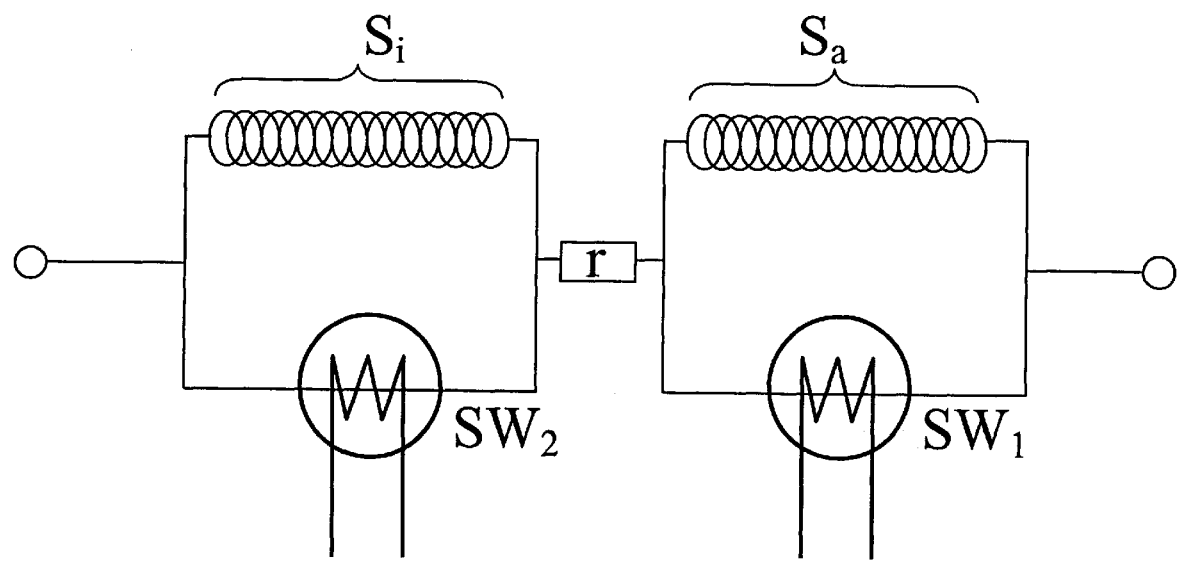
FIG. 9 shows a resistive series connection between the radially inner and radially outer shim coil set.

FIG. 9, however, shows a wiring diagram of the radially inner and radially outer shim coil set $S_i$ and $S_a$ of an inventive $Z^2$ shim comprising resistive series connection (shown by the equivalent resistance r) of the two shim coil sets. The first superconducting switch $SW_1$ bridges the radially outer shim coil set $S_a$, the second superconducting switch $SW_2$ bridges the radially inner shim coil set $S_i$.

Figure 10:
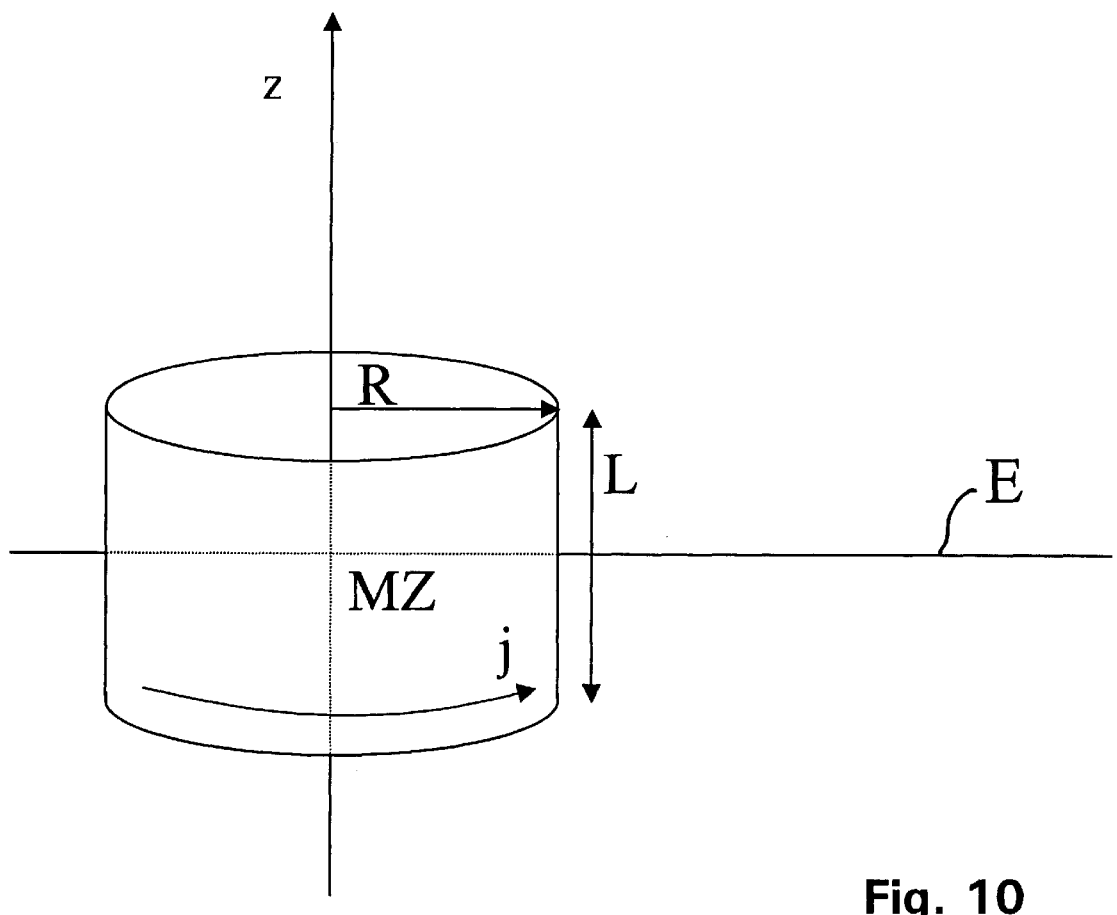
FIG. 10 shows a diagrammatic view of a cylindrical current sheet symmetrical to the magnetic center.

FIG. 10 finally shows the scheme of a cylindrical current density j having a radius R and a length L symmetrical to the magnetic center MZ.

The magnetic resonance methods require good homogeneity of the magnetic field in the sample volume. To achieve this object, on the one hand, good basic homogeneity of the field must be achieved by suitable means in the magnet coil design and on the other hand, production deviations from the predetermined basic homogeneity have to be compensated for by further means.

The magnetic field of a cylindrically symmetric magnet system on the axis of symmetry (direction z) in the vicinity of the magnetic center (z=0) is axial for reasons of symmetry and can be expressed as $$B(z)=H_0+H_2z^2+H_4z^4+H_6z^6+H_8z^8+$$

if the magnet coils are disposed symmetrically to the magnetic center. To obtain an as good as possible basic field homogeneity, it is required to bring the coefficients of a low order to zero in the magnet design. One would typically want $H_2=H_4=0$ (possibly $H_6=0$). The coefficients $H_n$ of the field development are also called gradients.

Larger deviations from the theoretical field homogeneity occur mainly in the coefficients of low orders, in particular in the form of non-disappearing coefficients $H_1$ and $H_2$ but also as deviations from the absolute cylindrical symmetry of the field. Correction of these field inhomogeneities with superconducting magnet systems is possible e.g. by integrating superconducting shim coils into the magnet system. Each of these coils has a specific field profile, i.e. generates a certain field gradient and can be operated with a separate current and be short-circuited in itself via a superconducting switch. The homogeneity of the magnet system can be considerably improved through selection of the various currents. Unfortunately, each of the shims requires valuable space which is then lost for the magnet coils. For the so-called $Z^2$ shim, the invention provides a particularly compact and efficient solution which enlarges the magnet only slightly.

The $Z^2$ shim eliminates an undesired $H_2$ gradient of the magnet, i.e. the field profile of this shim on the magnet axis is proportional to $Z^2$. The efficiency or strength $c_2$ of the $Z^2$ shim is the $H_2$ gradient generated per ampere.

We consider a current density j (in [A/cm]) on a cylinder of a length L symmetrical to the magnetic center (see FIG. 10). This specific current density generates on the cylinder axis an axial field of the size $$B_z = H_0 + H_2 \cdot Z^2 + H_4 \cdot Z^4 +$$

With the dimension-less size $$s = \frac{L}{2R}$$

the gradients $H_0$, $H_2$ and $H_4$ (in [Gauss/cm$^n$]) can be represented as:

$$H_0 = j y_0(s)$$

$$H_2 = \frac{j}{R^2} y_2(s)$$

$$H_4 = \frac{j}{R^4} y_4(s)$$

with functions $Y_0(S)$ $Y_2(s)$ and $Y_4(S)$ of the dimension [G·cm/A] shown in FIG. 4. Therein, R is the cylinder radius in [cm]. Important is the fact that the efficiency of the gradient $H^n$ is inversely proportional to the nth power of the radius R. (FIG. 3: $H_0(R)$, $H_2(R)$ and $H_4(R)$ for a current carrying cylinder surface with a fixed length L and fixed current density j). The dependence of the gradient efficiency of a coil from its radius implies that a $Z^2$ shim has to be disposed on a small radius if a large shim efficiency has to be achieved.

In addition to the strength $c_2$ of the $Z^2$ shim which has to be achieved, also other criteria have to be met in the design of the shims for superconducting magnet systems. In particular, the shim must not generate a homogeneous field part $\Delta H_0$ and has to be inductively decoupled from the superconducting magnet. Otherwise, undesired effects would occur, such as field distortion during shimming, shim current changes in the case of magnet drift or high induced currents in the shim during a magnet quench.

In a conventional $Z^2$ shim as in FIG. 2 (shown as part of an actively stray field shielded magnet system), one tries to meet all these criteria by arranging coils on the same radius which should be as small as possible to achieve maximum efficiency. Therein, a considerable part of the possible shim efficiency $c_2$ gets lost due to decoupling from the magnet and suppression of the $\Delta H_0$ contribution of the shim. In particular, suppression of the $\Delta H_0$ contribution can be achieved also by a shim coil set on a considerably larger radius than required for efficient generation of the $H_2$ gradient, as shown in FIG. 3. The present invention utilizes this possibility. By separating the $Z^2$ shim into a radially inner coil set which is optimized to a maximum shim strength $c_2$ neglecting the $\Delta H_0$ impurity generated thereby, and a radially outer shim coil set compensating the $\Delta H_0$ impurity the resulting shim efficiency can be strongly increased. Due to the quadratic radius dependence of the $H_2$ gradient of a coil, the radially outer shim coil set contributes only slightly to the entire shim efficiency.

The inventive $Z^2$ shim coil system pays off in particular when used in actively stray field shielded superconducting magnet systems since therein, enlargement of the main coil of the magnet through integrated shim coils has to be absolutely avoided due to the resulting stray field increase and because particularly favorable solutions exist for the inventive coil system of a $Z^2$ shim. For this reason, the invention is limited to the description of a $Z^2$ shim divided into a radially inner and a radially outer shim coil set in an actively shielded magnet. FIG. 1 shows an inventive coil system of a $Z^2$ shim together with a magnet with active stray field compensation.

From the above discussion of a field generated by cylindrical current density, one can derive a coil configuration for a $Z^2$ shim which achieves an optimum with respect to the maximum gradient strength $c_2$. Since the individual shim coils are usually thin-walled solenoids, the approximation by a cylindrical current density is justified. For a hypothetical shim consisting of a single solenoid, which is symmetrical to the magnetic center, and on a given radius R, a length of $L_1 \approx R$ results for maximum $H_2$ efficiency from the extremum of $y_2(s)$ with $s \approx 0.5$ (with $S=L/2R$) (FIG. 4). Almost the same effect is achieved with a very long solenoid (approximately $L_2>4R$) if a length of $L_3 \approx R$ remains free in the center (so-called "notch"). The generated $H_2$ gradient then has the opposite sign compared to the previous system. The combination of both coil systems produces a configuration with three coils in total with the maximum $H_2$ efficiency which can be achieved at all for a certain specific current density on a radius R (see FIG. 5).

Depending on the radius R, such a system generates a larger or smaller $H_4$ "impurity" $\Delta H_4$ in the field. This can be counteracted in two ways:

1. By increasing $L_1$ and $L_3$ one brings the coils closer to the zero crossing of the function $Y_4(s)$ relevant for $H_4$ with $s \approx 0.9$.
2. By fitting in a very short notch in the central coil with typically $s<0.2$ (FIG. 6).

Both ways reduce of course the $H_2$ efficiency of the coil configuration. In total, one obtains a configuration of maximum $H_2$ efficiency by keeping the $H_4$ impurity low however, neglecting the $H_0$ impurity $\Delta H_0$ Coupling with the magnet can be generally eliminated by suitable choice of the length $L_2$. Such a configuration is therefore optimal for the radially inner shim coil set of an inventive $Z^2$ shim (FIGS. 5 and 6).

To eliminate also $\Delta H_0$, it is advantageous to mount further coils on a much larger radius. These coils hardly influence the $H_2$ efficiency of the inner shim coil set since the $H_2$ efficiency of a current carrying cylindrical surface decreases with the square of the radius. Optimum $\Delta H_0$ compensation with the radially outer shim coil set is achieved with one single coil centered about the central axis of the magnet. To avoid introduction of additional shim coils of different polarity for decoupling the radially outer shim coil set from the magnet, one can utilize in an actively shielded magnet, the opposite polarities of main coil and stray field shielding coil for decoupling.

The main problem of the invention with respect to a conventional $Z^2$ shim consists in that the optimum embodiment of the radially outer shim coil set has a large dipole moment. This causes strong coupling with external field disturbance sources, possibly also with sweep coils or field-lock coils. This may cause undesired temporary fluctuations of the shim current and thereby an $H_2$ field gradient which varies with time. The problem is solved as follows:

1. The radially inner and the radially outer shim coil set are individually decoupled from the magnet. For decoupling the outer shim coil set from the actively shielded magnet, one utilizes advantageously the different polarity of main coil and stray field shielding.
2. The radially inner and the radially outer shim coil sets are separately superconductingly short-circuited. The separate decoupling from the magnet eliminates undesired effects such as shim current changes due to a magnet drift or high induced currents in the shim during a magnet quench even when the two shim coil sets are separately superconductingly short-circuited.
3. To obtain good stability of the $H_2$ homogeneity with external field fluctuations/activation of the field lock/operation of the field sweep coils, it is now sufficient to decouple the inner shim coil set from the disturbance source/the lock coil/the sweep coils since the outer shim coil set generates only little $H_2$. Decoupling of the inner shim coil set from an external disturbance source is achieved in case of a homogeneous field disturbance by reducing the dipole moment of the inner shim coil set.
4. Additionally improved temporary stability of the $H_2$ homogeneity is achieved by decoupling the radially inner from the radially outer shim coil set since then a current cannot be induced in the radially inner shim coil set by an induced current induced in the radially outer shim coil set.

Reaction of the radially outer shim coil set in case of external field fluctuations/activation of the field lock/operation of field sweep coils, firstly influences the temporary behavior of the homogeneous field part $H_0(t)$ in the sample volume. An optimum design solution for the radially outer shim coil set is achieved if the interaction with the field lock coil and possibly with field sweep coils disappears while, during external disturbances, a current change in the radially outer shim coil set is desired which builds up a field counteracting the disturbing field. If the field lock coil and field sweep coils are disposed in the area of the magnet center, the desired behavior of the radially outer shim coil set with respect to the coils will result merely by the large radius of the shim coils without further design measures. As to the behavior with respect to external field disturbance sources, one obtains, in particular with actively shielded magnets, in general a good improvement of the susceptibility of the magnet system to the homogeneous field contribution of external field fluctuations due to the basic configuration of the inventive $Z^2$ shim system with separate superconducting short-circuit of radially inner and outer shim coil sets without further design measures.

The separate superconducting short-circuit of radially inner and outer shim coil sets has two further advantageous consequences:

The radially inner and outer shim coil sets can be connected not only superconductingly but also resistively which makes the shims easier to manufacture.

The two shim coil sets can be operated with different currents. There is in particular the possibility to operate the radially outer shim coil set as $Z^0$ shim since it meets all requirements of such a shim. It is decoupled from all superconductingly short-circuited current paths in the magnet system and generates a homogeneous field $H_0$.

Possible realizations of the separate superconducting short-circuit of radially inner and outer shim coil sets are schematically shown in FIGS. 7–9. The resistive connection between radially inner and outer shim coil sets is symbolized by an equivalent resistance r. In the case of a superconducting connection between the radially inner and outer shim coil sets, the differential current between radially inner and outer shim coil sets can be limited by a current limiter CL.

When the radially inner and outer shim coil sets are separately superconductingly short-circuited, both superconductingly short-circuited current paths must have their own superconducting switch which is opened for charging the associated current path. During charging of the total shim, both switches must be open simultaneously. This is automatically the case if the switch heaters are connected in series. In certain situations, such as e.g. use of the radially outer shim coil set as $Z^0$ shim, it is required that the individual switches can additionally also be opened individually.

We claim:

1. A superconducting magnet system for a magnetic resonance spectrometer, the magnet system having an actively shielded superconducting magnet for generating a homogeneous magnetic field along a z-axis in a working volume disposed about z=0, the superconducting magnet system also having a superconducting shim coil system for correcting magnetic field inhomogeneities in the working volume, the superconducting magnet system comprising:

a radially inner coil system;

a radially outer coil system, said radially inner and said radially outer coil systems carrying approximately equal currents and having approximately equal and opposite dipole moments;

a radially inner shim coil set, said inner shim set substantially inductively decoupled from both said radially inner coil system and said radially outer coil system, said inner shim set substantially generating a magnetic field in the working volume whose z component varies like $\Delta H_0 + C_2 z^2$ with $C_2$=constant; and a radially outer shim coil set, said outer shim set substantially inductively decoupled from both said radially inner and said radially outer coil systems, said outer shim set substantially generating a magnetic field of $-\Delta H_0$ in the working volume.

2. The magnet system of claim 1, further comprising means for separate superconducting short-circuiting of said radially inner shim coil set and of said radially outer shim coil set.

3. The magnet system of claim 1, further comprising means for high-resolution magnetic resonance spectroscopy.

4. The magnet system of claim 3, wherein said spectroscopy means comprise means for field-locking the homogeneous magnetic field generated in the working volume, wherein said radially inner shim coil set and said radially outer shim coil set are largely decoupled from coils of said field-locking means.

5. The magnet system of claim 3, wherein said spectroscopy means comprise sweep coils, said radially inner shim coil set and said radially outer shim coil set being largely decoupled from said sweep coils.

6. The magnet system of claim 1, wherein at least one of said radially inner and said radially outer shim coil sets comprise a plurality of partial coils.

7. The magnet system of claim 6, wherein said radially inner shim coil set consists essentially of three partial coils disposed axially one behind the other and symmetrically about z=0 at a radius R from the z-axis, wherein a central partial coil has an axial length $L_1$ of $R \leq L_1 \leq 1.5R$ and two axially outer partial coils each have a polarity opposite to a polarity of said central partial coil.

8. The magnet system of claim 7, wherein said central partial coil consists essentially of two symmetrical coils wound in a same direction.

9. The magnet system of claim 6, wherein said radially outer shim coil set comprises partial coils all having a same polarity.

10. The magnet system of claim 1, wherein said radially outer shim coil set is radially disposed proximate said radially outer coil system.

11. The magnet system of claim 1, wherein coils of at least one of said radially inner and said radially outer shim coil set are distributed at several radii.

12. The magnet system of claim 1, wherein said radially inner shim coil set has a dipole moment which is one of smaller than and negligible compared to a dipole moment of said radially outer shim coil set.

13. The magnet system of claim 1, wherein said radially inner and said radially outer shim coil sets are substantially inductively decoupled from another.

14. The magnet system of claim 13, wherein said radially outer shim coil set is a $Z^0$ shim.

15. The magnet system of claim 1, wherein said radially inner shim coil set is electrically connected in series with said radially outer shim coil set, and further comprising at least a first and a second superconducting switch with which said radially inner and radially outer shim coil sets can be superconductingly short-circuited, independently of one another.

16. The magnet system of claim 15, wherein a connection between said radially inner and said radially outer shim coil set is superconducting and wherein said first superconducting switch is connected in parallel with both said radially inner and said radially outer shim coil sets and said second superconducting switch is connected in parallel with one of said radially inner and said radially outer shim coil sets.

17. The magnet system of claim 16, further comprising a current limiter to reduce a differential current between said radially inner and said radially outer shim coil sets.

18. The magnet system of claim 15, wherein said radially inner and radially outer shim coil sets are resistively connected in series, wherein said first superconducting switch is connected in parallel with said radially inner shim coil and said second superconducting switch is connected in parallel with said radially outer shim coil set.

19. The magnet system of claim 15, wherein a connection between said radially inner and said radially outer shim coil set is superconducting, wherein said first superconducting switch shim is connected in parallel to said radially inner set and said second superconducting switch is connected in parallel to said radially outer shim set.

20. The magnet system of claim 17, further comprising a current limiter to reduce a differential current between said radially inner and said radially outer shim coil sets.

21. The magnet system of claim 15, wherein said first superconducting switch comprises a first heating means and said second superconducting switch comprises a second heating means, said second heating means electrically connected in series with said first heating means.

22. The magnet system of claim 21, further comprising means for separate heating of said first and said second heating means.

* * * * *